United States Patent
Swarnkar et al.

(10) Patent No.: US 8,522,090 B1
(45) Date of Patent: Aug. 27, 2013

(54) AUTOMATED SCAN TESTING OF A SYSTEM-ON-CHIP (SOC)

(75) Inventors: Jitendra Kumar Swarnkar, Sunnyvale, CA (US); Vincent Wong, Fremont, CA (US); Yun-Ho Wu, Milpitas, CA (US); Rakeshkumar K. Patel, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/114,981

(22) Filed: May 24, 2011

Related U.S. Application Data

(63) Continuation-in-part of application No. 12/876,654, filed on Sep. 7, 2010, now Pat. No. 7,971,111, and a continuation of application No. 11/972,567, filed on Jan. 10, 2008, now Pat. No. 7,793,175.

(60) Provisional application No. 60/884,319, filed on Jan. 10, 2007, provisional application No. 61/427,041, filed on Dec. 23, 2010.

(51) Int. Cl.
*G11C 29/00* (2006.01)

(52) U.S. Cl.
USPC ............................................. 714/718

(58) Field of Classification Search
USPC .......................................... 714/718, 724, 733
See application file for complete search history.

(56) References Cited

U.S. PATENT DOCUMENTS

| | | | | |
|---|---|---|---|---|
| 6,816,991 B2 * | 11/2004 | Sanghani | ....................... | 714/733 |
| 6,857,089 B2 * | 2/2005 | Schaber et al. | ................ | 714/724 |
| 6,952,111 B1 * | 10/2005 | Chih-Hui | ................. | 324/762.01 |
| 7,003,697 B2 * | 2/2006 | Magliocco | ..................... | 714/25 |
| 7,034,564 B2 * | 4/2006 | Yeh | ........................... | 324/756.02 |
| 7,228,477 B2 * | 6/2007 | Thalmann | ..................... | 714/735 |
| 7,334,159 B1 * | 2/2008 | Callaghan | ........................ | 714/30 |
| 7,405,980 B1 * | 7/2008 | Azimi et al. | ............. | 365/189.03 |
| 7,457,177 B2 * | 11/2008 | Perry et al. | .................... | 365/201 |
| 7,559,000 B2 * | 7/2009 | Sato | ................. | 714/738 |
| 7,565,593 B2 * | 7/2009 | Dixon et al. | .................. | 714/754 |
| 7,586,955 B2 * | 9/2009 | Iizuka | ........................... | 370/516 |
| 7,610,526 B2 * | 10/2009 | Sherlock et al. | ............... | 714/724 |
| 7,788,562 B2 * | 8/2010 | Brennan et al. | ............... | 714/732 |

* cited by examiner

*Primary Examiner* — James C Kerveros

(57) ABSTRACT

A method of testing a double data rate (DDR) memory interface within a System-on-chip (SoC). The method comprises generating a data stream within the SoC and writing the data stream to an internal memory within the SoC via the DDR memory interface. The method further comprises reading the data stream from the internal memory within the SoC and comparing the data stream generated within the SoC with the data stream read from the internal memory within the SoC.

15 Claims, 11 Drawing Sheets

AUTOMATED SCAN TESTING OF A SYSTEM-ON-CHIP (SOC)

CROSS REFERENCE TO RELATED APPLICATIONS

The present application is a continuation-in-part of non-provisional U.S. patent application Ser. No. 12/876,654, filed Sep. 10, 2010, now U.S. Pat. No. 7,971,111, issued Jun. 28, 2011, which is a continuation of non-provisional U.S. patent application Ser. No. 11/972,567, filed Jan. 10, 2008, now U.S. Pat. No. 7,793,175, issued Sep. 7, 2010, which claims the benefit of U.S. Provisional Patent Application No. 60/884,319, filed Jan. 10, 2007, the entire specifications of which are hereby incorporated by reference in their entireties for all purposes, except for those sections, if any, that are inconsistent with this specification. The present application also claims the benefit of U.S. Provisional Patent Application No. 61/427,041, filed Dec. 23, 2010, the entire specification of which is hereby incorporated by reference in its entirety for all purposes, except for those sections, if any, that are inconsistent with this specification.

FIELD OF THE INVENTION

The present invention relates to the automatic detection of defects in memory devices and more specifically to detection of defects in memory devices during runtime.

BACKGROUND

Memory devices used in computing applications typically have a small number of unavoidable defects in memory cells that are created during the manufacturing process. Furthermore, defects in memory cells of memory devices can occur during the operational lifetime of the memory devices. To overcome these defects, Content Addressable Memory (CAM) schemes may be used to map the defective memory cells in a memory device such that the defects can be avoided during runtime. In a conventional Random Access Memory (RAM) device, a user supplies a memory address and the RAM device returns the data word stored at that address. In contrast, CAM is designed such that the user supplies a data word and the CAM searches the entire memory to see if that data word is stored anywhere in the memory. If the data word is found, the CAM returns a list of one or more storage addresses where the word was found (and in some architectures, it also returns the data word, or other associated pieces of data).

A defect mapping process may be used to fully test the memory device and map any defects that are found such that subsequent processes may use the memory while avoiding the defects. During defect mapping, the mapping process fully monopolizes the memory device being testing. Therefore, the defect mapping process is typically only used at the time of manufacture of the memory device before the memory device is released for use, or during some dedicated initialization step in a larger application or hardware initialization process. However, as the mapping process fully monopolizes the memory during mapping, the mapping process cannot be used during runtime as the mapping process would prevent other applications from accessing the memory device.

Additionally, data storage utilizing System-on-Chip (SoC) functionality involves many complex circuits to be run at very high speeds. Testing the functionality of these circuits with automated test equipment (ATE) and making sure that the chip runs at the target speed without any issues is very critical.

To test the SoC on the ATE, a method for integrated system test (MIST) logic is implemented in the SoC. MIST logic, along with the appropriate firmware set-up can control the data path to emulate the system functionality and validate the circuits. In particular, double data rate (DDR) memory interface testing at the ATE at a maximum defined speed, commonly referred to as an at-speed test, is a major issue in all the SoCs that include the high speed DDR memory interface. Such a shortfall causes an increase in the defective parts per million (DPPM) and increased debug time, thereby leading to an increased production cost.

SUMMARY

In accordance with various embodiments, the present disclosure provides a method of testing a double data rate (DDR) memory interface within a System-on-chip (SoC), where the method comprises generating a data stream within the SoC and writing the data stream to an internal memory within the SoC via the DDR memory interface. The method further comprises reading the data stream from the internal memory within the SoC and comparing the data stream generated within the SoC with the data stream read from the internal memory within the SoC.

In accordance with various embodiments, the present disclosure also provides a system on a chip comprising a double data rate (DDR) memory interface, an internal memory coupled to the DDR memory interface, and a diagnostics block for generating a data stream for use in testing the system on a chip. The System on Chip further comprises means for writing the data stream to the internal memory via the DDR memory interface, means for reading the data stream from the internal memory, and means for comparing the data stream written to the internal memory within the SOC with the data stream read from the internal memory.

DETAILED DESCRIPTION

Figure 1:
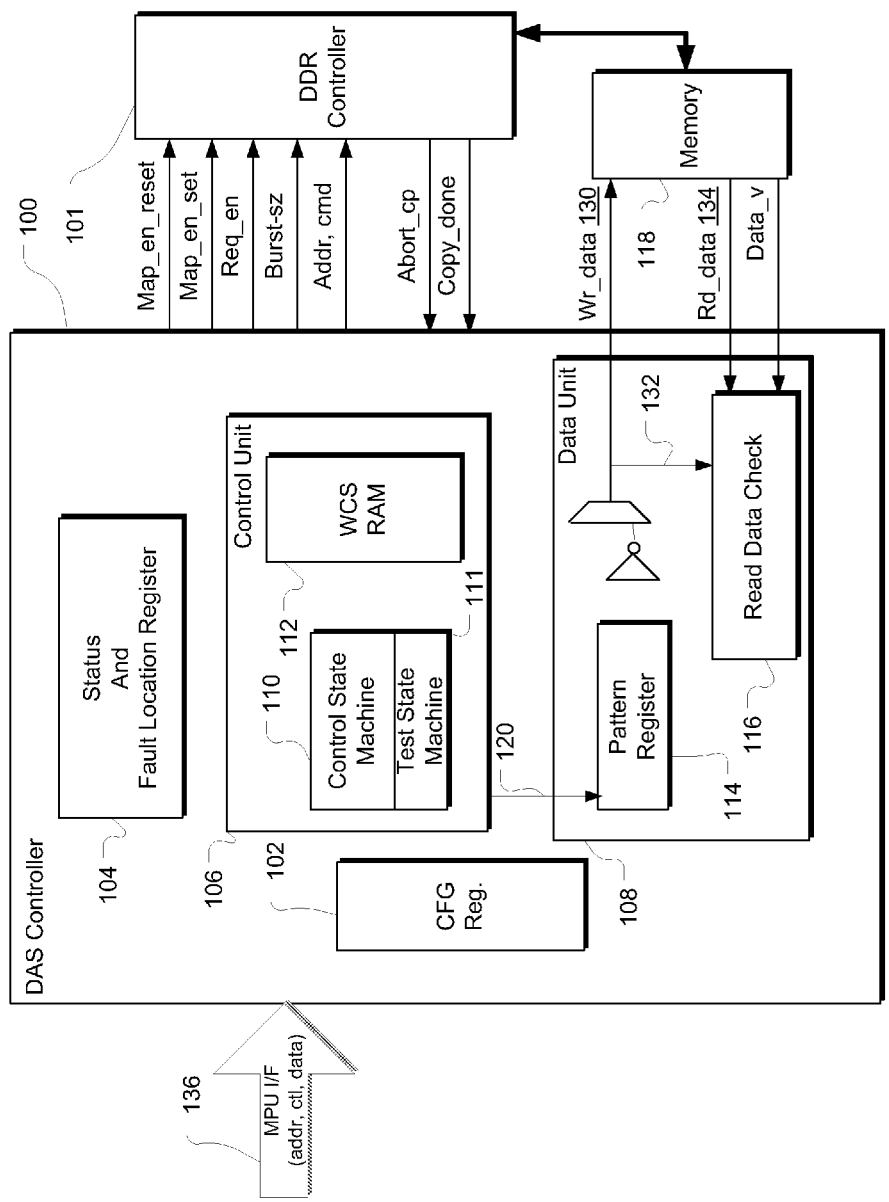
FIG. 1 is an architecture diagram of a DAS controller in accordance with an exemplary embodiment of the invention.

FIG. 1 is an architecture diagram of a DDR Auto Scan (DAS) controller 100 in accordance with an exemplary embodiment of the invention.

The DAS controller 100 controls the scan process. The DAS controller 100 is separate from a DDR controller 101; however the DAS controller 100 works in tandem with the DDR controller 101. In one implementation, the DDR controller 101 is used to temporarily store the data of the DDR SDRAM that are being scanned.

The DAS controller 100 includes configuration (CFG) registers 102, status and fault location registers 104, a control unit 106, and a data unit 108. The control unit 106 also includes a control state machine 110 and a test state machine 111. The test state machine 111 is programmable using operational instructions stored in a Writable Control Store (WCS) Random Access Memory (RAM) 112. The data unit 108 includes a pattern register 114 and a read data check unit 116.

Test flow is controlled by the control unit 106. The control unit 106 has two state machines to control the flow of the test. The control state machine 110, described in connection with FIG. 2A, controls the flow of the complete scan. The test state machine 111, described in FIG. 2B, performs the testing of memory 118. In one implementation, the test state machine 111 is triggered by the control state machine 110 when the control state machine 110 enters a "test in progress" state.

The control unit 106 controls the test using the test state machine 111. The test state machine 111 is responsible for generating control signals 120 transmitted to the data unit 108 and for updating the status and fault location register 104 as well.

In one implementation, the control unit 106 maintains the following counters:

"ddr_rd_cnt" keeps track of which read data belong to which address. The counter is loaded in a rd_cmd_burst_size state and is decremented each time a ddr_rd_data is received.

"wcs_lpback_cnt" is used for stepping through the instructions stored in the WCS RAM 112. The counter is loaded when a loopback command is decoded. The value loaded into the counter comes from the WCS instruction when the instruction is decoded. The counter is decremented after each iteration.

"ddr_cmd_cnt" is used to keep track of a ddr_cmd that is issued. For example, to read, write or copy a 1K block of memory, the counter is loaded by 1K and is decremented by a burst size of the read, write or copy operation each time a burst is completed as indicated by an acknowledgement from the DDR controller 101.

The data unit 108 controls write data pattern generation and read data checking. Write data pattern generation is done using the pattern register 114. The pattern register 114 is loaded by the control unit 106. The contents of the pattern register 114 can be shifted by 1 bit at a time. In one implementation, the shifting is controlled by a "shift_en_cu" signal from the control unit 106. The actual write data 130 written to the memory 118 can be a pattern stored in the pattern register 114, the inversion of the pattern stored in the pattern register 114, or all 0s. In one implementation, the selection of the pattern is controlled by the control unit 106 using a "data_select_cu" signal.

The data read from the memory 118 is checked against the expected data 132, which is generated in the same manner as the write data 130. In one implementation, if there is a mismatch between the read data 134 and the expected data 132, the control unit 106 is informed using an error signal "rd_err_du".

In one implementation, the DAS controller has following configuration, status and fault location registers:
 DDR Auto Scan Segment Start Address (R/W)
 DDR Auto Scan Segment End Address (R/W)
 DDR Auto Scan current target Start Address (RO)
 DDR Auto Scan current target offset Address (RO). This is a 10 bit register to point to a location within the 1 KB block.
 DDR Auto Scan control
 DDR Auto Scan Status
 Interrupt mask
 Fault locations In operation (in one implementation), the DAS controller 100 receives (136) a test sequence, a segment start and end address, and a test loop count from a microprocessor unit (MPU) (not shown). The MPU then transmits a ddr_scan_on signal to tell the DAS controller 100 to begin scanning the memory 118. The location of any defects found in the memory 118 are stored in the status and fault location register 104.

Figure 2A:
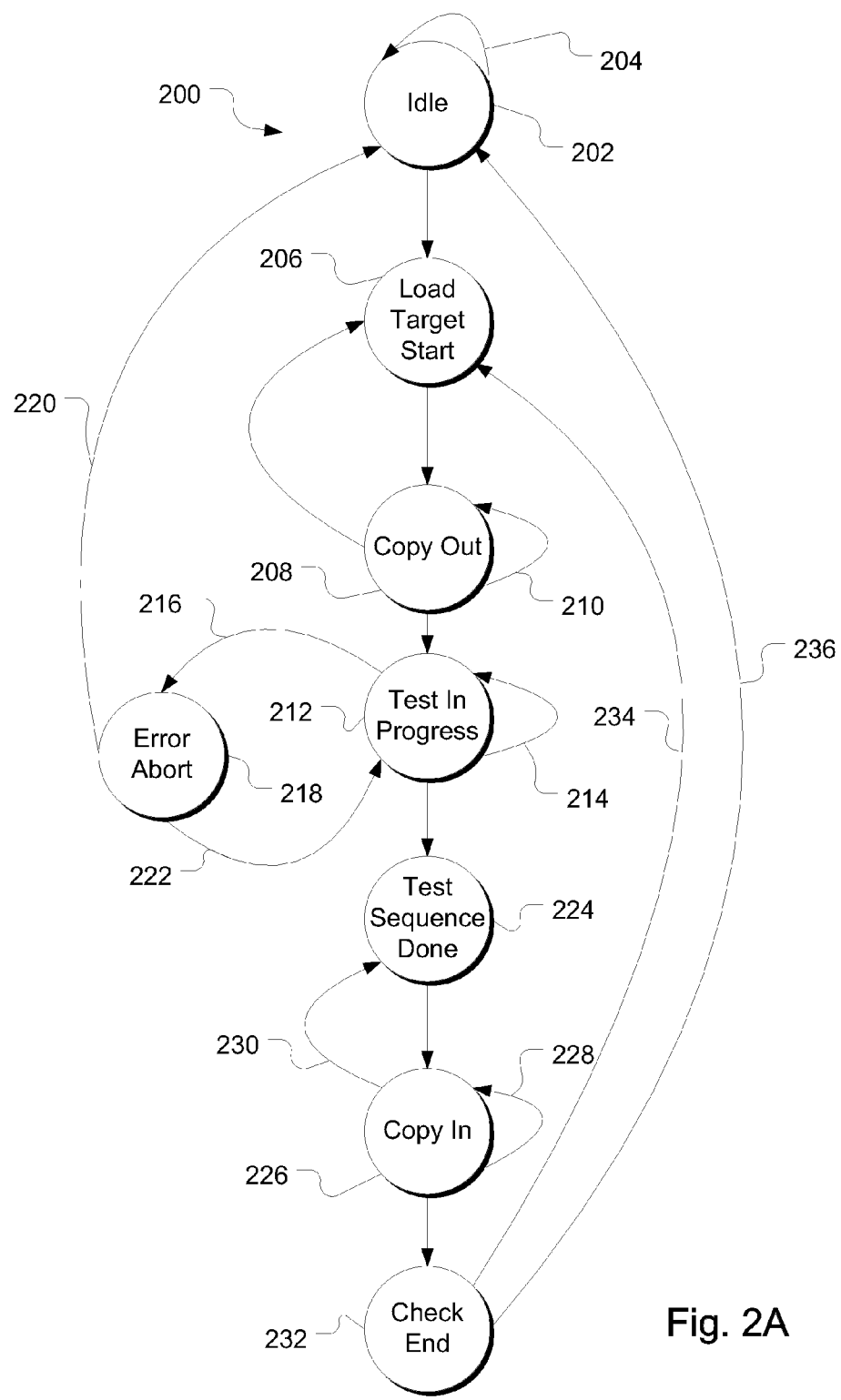
FIG. 2A is a state diagram of a control state machine in accordance with an exemplary embodiment of the invention.
Figure 3:
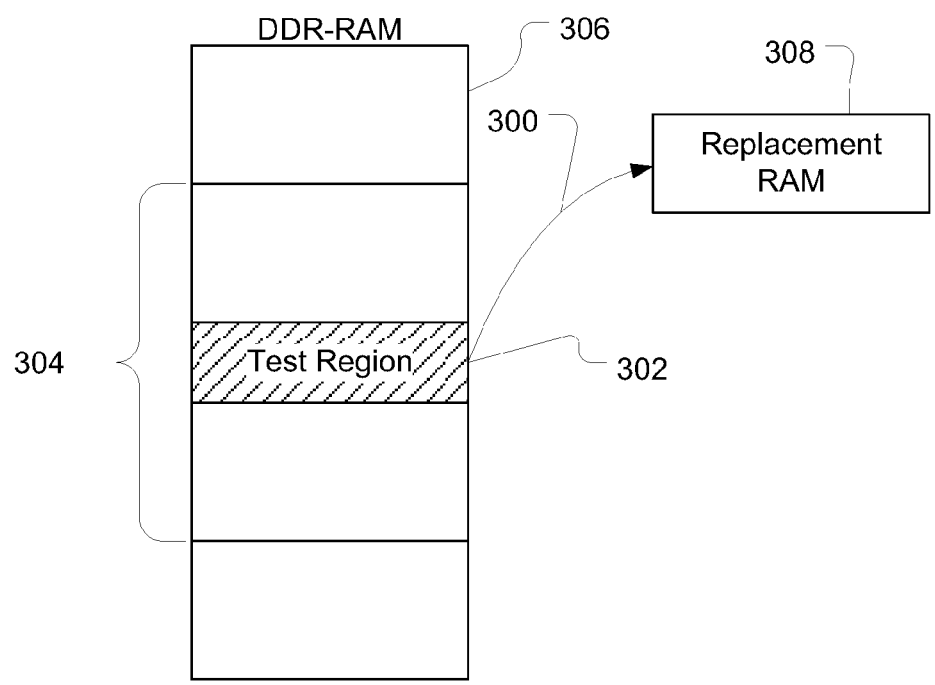
FIG. 3 is a memory diagram of a memory during a copy out operation in accordance with an exemplary embodiment of the invention.
Figure 4:
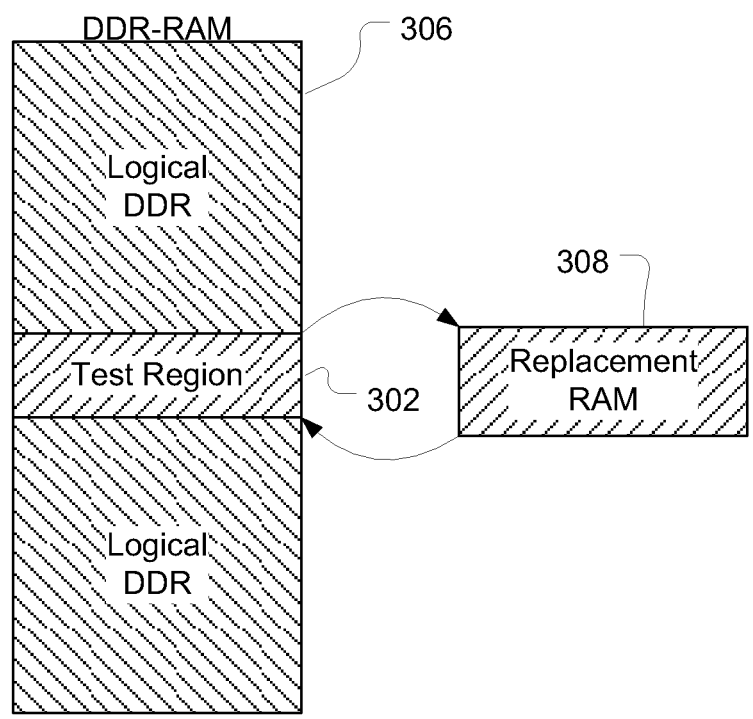
FIG. 4 is a memory diagram of a memory during testing in accordance with an exemplary embodiment of the invention.
Figure 5:
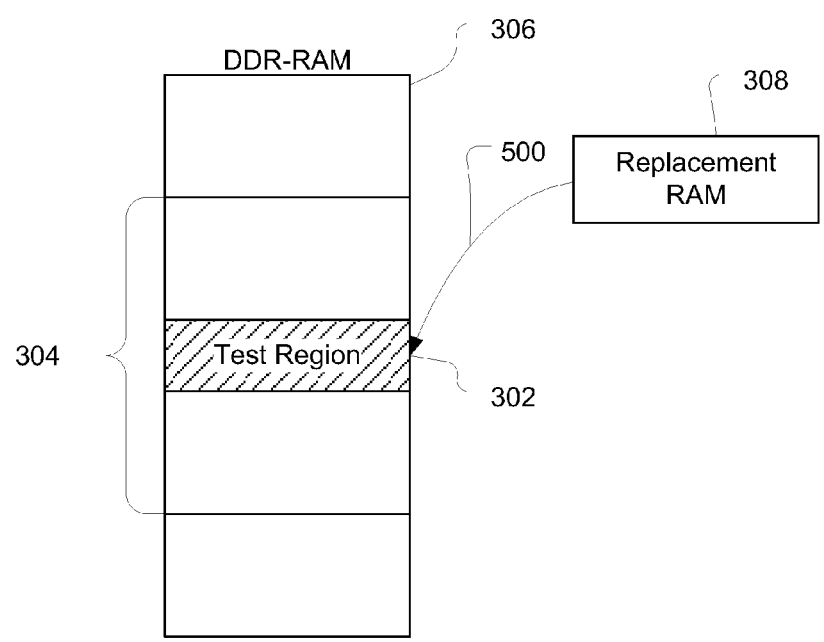
FIG. 5 is a memory diagram of a memory during a copy in operation in accordance with an exemplary embodiment of the invention.

Having described the structure of the DAS controller 100 in reference to FIG. 1, one implementation, of the test control and testing operations of the DAS controller 100 will now be described in reference to FIG. 2A, FIG. 3, FIG. 4 and FIG. 5 where FIG. 2A is a state diagram of a control state machine 200, FIG. 3 is a memory diagram of a memory 306 during a copy out operation, FIG. 4 is a memory diagram of memory 306 during testing and FIG. 5 is a memory diagram of memory 306 during a copy in operation.

Referring now to FIG. 2, the control state machine 200 waits in a wait state 202 while a scan enable signal 204 is low. The control state machine 200 then transitions to a load target start state 206 where the control state machine 200 loads a start address for scanning of a memory (not shown).

Referring now to FIG. 3 as well as FIG. 2A, the control state machine 200 then transitions to a copy out state 208 where the control state machine copies (300) the contents of a test region 302 of memory out of a segment 304 (of memory 306) to be scanned. The test region 302 is copied into an on-chip replacement RAM 308. During the scan test, test region 302 is not accessible by an application using memory 306. Instead, DAS controller 100 maps locations in test region 302 to replacement RAM 308 in a manner transparent to the application. Hence, although replacement RAM 308 and memory 306 are two separate physical entities, during the scan test, replacement RAM 308 become a single logical entity. The control state machine 200 continues the copying while an abort copy signal and copy complete signal 210 remain low.

Referring now to FIG. 4 as well as FIG. 2A, when the copy complete signal 210 goes high, the control state machine 200 transitions to a test in progress state 212 where a test state machine (described in connection with FIG. 2B) executes the actual test of the test region 302. The control state machine 200 remains in the test in progress state 212 while a test sequence done signal 214 remains low. If an error signal 216 is detected, the control state machine 200 transitions to an error abort state 218. If an abort on error signal 220 is detected the control state machine 200 returns to the idle state 202.

However, if a continue on error signal 222 is detected, the control state machine 200 returns to the test in progress state 212.

Referring now to FIG. 5 as well as FIG. 2A, when the test sequence done signal 214 goes high, the control state machine 200 transitions to a test sequence done state 224 and then a copy in state 226. While a copy in completed signal and abort copy signal 228 remain low, the control state machine 200 copies (500) the contents of on-chip replacement RAM 308 back into the test region 302 of segment 304 of memory 306. If a copy abort signal 230 goes high, the control state machine 200 transitions back (236) to the test sequence done state 224.

If the copy in is successful, the control state machine 200 transitions to a check end state 232. If a segment end is reached and a test count has not been exceeded, the control state machine 200 transitions back to the load target start state 206 and loads the starting address of a new segment of the memory to test. However, if the segment end is reached and the test count is exceeded, the control state machine 200 transitions (236) back to the idle state 202.

In one embodiment of DAS controller 100 a burst size for the auto scan request is not more than the other agent in the same slot. Furthermore, the DAS controller 100 is placed in the lowest priority request channel in its slot. In this way, the DAS controller operations will have little or no impact on overall system performance.

In another embodiment of DAS controller 100, if there is any attempt by another device to write to a scan test region, the control state machine 200 will abort the copy out operation and wait for a period of time before restarting the copy out from the beginning of the scan test region.

In another embodiment of DAS controller 100, if an error is reported during testing, the control state machine 200 will stop and raise status and/or interrupts for the MPU to intervene. The MPU can abort the test or resume the test by programming a specified control bit.

In another embodiment of DAS controller 100, if another device attempts to write to the scan test region during the copy in, the control state machine 200 will abort the copy in and wait for a period of time and re-start the copy in from the beginning of the scan test region.

In another embodiment of DAS controller 100, the start and end addresses of a memory segment to be tested can be programmatically set allowing the DAS controller to test all or part of a memory device.

In another embodiment of DAS 100, the DAS controller 100 operates in the background mode compared to other processes accessing a memory device being scanned. In this way, the DAS controller 100 does not interfere with the other processes' use of the memory device.

In another embodiment of DAS controller 100, the DAS controller 100 only utilizes side bandwidth of a processing system that has not already been allocated to higher priority applications.

In another embodiment of DAS controller 100, the testing is performed periodically, interleaving burst modes and waiting modes, in order to conserve energy.

Figure 2B:
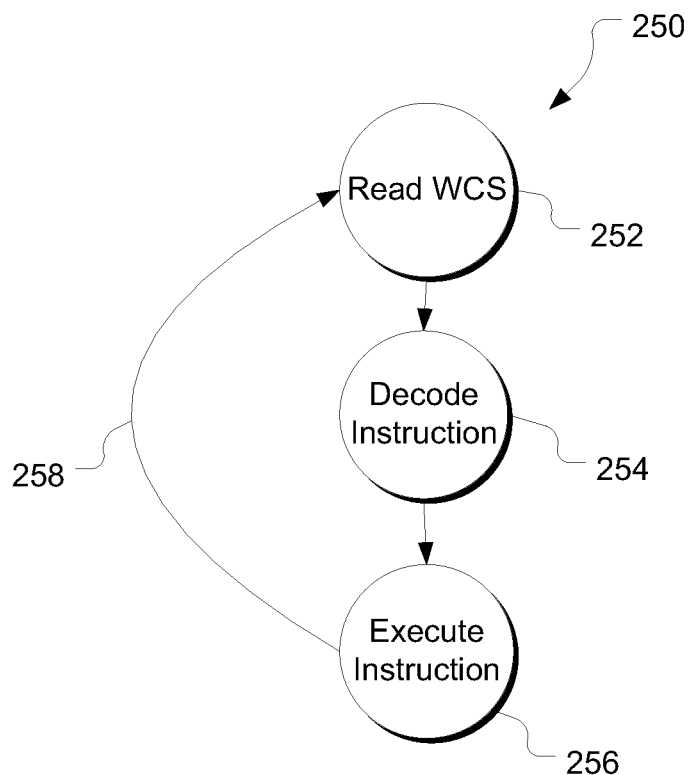
FIG. 2B is a state diagram of a test state machine in accordance with an exemplary embodiment of the invention.

Turning now to FIG. 2B, FIG. 2B is a state diagram of a test state machine 250 in accordance with an exemplary embodiment of the invention. In one implementation, the test state machine 250 is started in the test in progress state 212 (of FIG. 2A) and reads instructions stored in the WCS RAM 112 (of FIG. 1) to implement test scans performed on the memory 118 (of FIG. 1).

In a read WCS state 252, the test state machine 250 reads an instruction out of the WCS RAM 112. In a decode instruction state 254, the test state machine 250 decodes the instruction read out of the WCS RAM 112. In an execute state, the test state machine 250 executes the instruction read out of the WCS RAM. If there are more instructions to read out, the test state machine transitions (258) to the read WCS state 252.

In one implementation, the use of a WCS RAM 112 allows a DAS controller to generate different test patterns. For example, instructions for a walking 1, walking 0 or any fixed pattern may be programmed into the WCS RAM 112.

In one embodiment of DAS controller 100, a modified walking 1 pattern is used. As a typical DDR memory has a 32 bit word size, a 32 bit pattern of "0x0000_00001" is loaded into a pattern register and shifted by 1 for each location in a scanned memory segment so that every location will receive a unique pattern. However, after 32 locations, the pattern will start repeating. Hence, the pattern won't be unique anymore. To overcome this, after 32 locations, an inverted version of the pattern is used. This way 64 word locations (of 32 bits each) can be tested. As a 1 KB block of a scanned memory will have 128 words, the block can be tested in 2 parts. In this case, the instructions for the test sequence are:

INIT (Fill with all 0s)
Test a first half of the block of memory using a walking 1 test pattern
NIT and test $2^{nd}$ half of the memory block As another example of a programmable test pattern, a walking 0 pattern can be implemented in a similar manner as the modified walking 1 pattern as discussed above.

Walking 1 and 0 patterns will catch almost all issues related to decoding problems or word-line interference in a memory device. To make the test pattern more robust, the test can be repeated 32 times each time such that the starting pattern can be shifted so that each bit in the wordline is stressed.

Alternatively, an all toggle pattern can be used which will toggle bits within a wordline. Such a pattern will catch interference among bit cells within the wordline as well as interference among the bit cells of the neighboring wordlines.

In order to accommodate different sequences, test sequences are programmed by firmware using WCS RAM 112. The code from the WCS RAM 112 is executed by the DAS controller 100 when the control state machine 200 reaches the test in progress state 214 (both of FIG. 2A).

The following tables are illustrative of commands and variables used to program WCS RAM 112 in accordance with an exemplary embodiment of the invention and are presented by way of illustration and not of limitation.

TABLE 1

Command field definitions:

| Command | Definition |
| --- | --- |
| 000 | Marching |
| 001 | Walking |
| 010 | Loop Back N Times |
| 011 | Set Address |
| 100 | Write Pattern Lower Byte |
| 101 | Write Pattern Higher Byte |
| 110 | INIT(filing with 0s) |

TABLE 2

Marching command variables:

| Operation | $1^{st}$ Op Data | $2^{nd}$ Op Data | Address Change |
| --- | --- | --- | --- |
| 000: Single Read | 0: Pattern<br>1: ~Pattern | N/A | 00: No Change<br>01: Increment by 2<br>10: Decrement by 2 |

TABLE 2-continued

Marching command variables:

| Operation | 1st Op Data | 2nd Op Data | Address Change |
|---|---|---|---|
| 001: Burst Read (or, Read All) | 0: Pattern<br>1: ~Pattern | N/A | N/A |
| 010: Single Write | 0: Pattern<br>1: ~Pattern | N/A | 00: No Change<br>01: Increment by 2<br>10: Decrement by 2 |
| 011: Burst Write (or, Write All) | 0: Pattern<br>1: ~Pattern | N/A | N/A |
| 100: Read Write | 0: Pattern<br>1: ~Pattern | 0: Pattern<br>1: ~Pattern | 00: No Change<br>01: Increment by 2<br>10: Decrement by 2 |
| 101: Read Read | 0: Pattern<br>1: ~Pattern | 0: Pattern<br>1: ~Pattern | 00: No Change<br>01: Increment by 2<br>10: Decrement by 2 |
| 110: Write Write | 0: Pattern<br>1: ~Pattern | 0: Pattern<br>1: ~Pattern | 00: No Change<br>01: Increment by 2<br>10: Decrement by 2 |
| 111: Write Read | 0: Pattern<br>1: ~Pattern | 0: Pattern<br>1: ~Pattern | 00: No Change<br>01: Increment by 2<br>10: Decrement by 2 |

TABLE 3

Loop back command variable:

| Loop Back Instruction Number | Loop Count |
|---|---|
| 00000: 1 Instruction | 00: Once |
| ... | ... |
| 11111: 32 Instructions | FF: 256 Times |

A set address command sets the starting address of subsequent WCS instructions. A write pattern command writes the pattern (16 bit) for subsequent WCS instructions. For example, to program a walking 1 test followed by a marching increment, in one implementation, the WCS instructions are as follows:

Set_Addr 0x0000; // Start at 0x0000 offset
Write_Pattern_L 0x01;
Write_Pattern_H 0x00; // data pattern 0x0001
. . . Walking1 sequence . . . ; // walking 1 for the whole 1K page
Set_Addr 0000; // Start at 0x0000 offset
Write_Pattern_L 0x55;
Write_Pattern_H 0x00; // data pattern 0x0055
Marching, burst_write, pattern;
Loop_back, 1, 32; // W(D) for the whole 1K page
Marching, single_read, pattern, no_change;
Marching, write_read, !pattern, !pattern, inc;
Loop_back, 2, 256; // R(D)W(!D)R(!D) for the whole 1K page
Marching, single_read !pattern; no_change;
Marching, write_read, pattern, pattern inc;
Loop_back, 2, 256; //R(!D)W(D)R(D) for the whole 1K page
Marching, burst_read, pattern;
Loop_back, 1, 32; // R(D) for the whole page In a memory management system employing DAS controller 100 in accordance with an exemplary embodiment of the invention, a buffer manager will have a SRAM to temporarily store the data of the test target block of the DDR memory. In one implementation, the DAS controller 100 will have a configuration bit "ddr2sram_map_en", upon setting of which the buffer manager will automatically route any request to the test target block of the DDR memory to the ASRAM as illustrated in FIG. 4.

The buffer manager decodes the copy out or copy in command and treats the command as if the requesting agent is ASRAM, for example, data source (for copy in) or data sink (for copy out) is ASRAM. The command to the buffer manager has the following 2 bit encoding:

00: DDR Write, data from requesting agent
01: DDR Read, data goes to requesting agent
10: DDR Write for copy in, data comes from ASRAM
11: DDR Read for copy out, read data to ASRAM In a memory management system employing DAS controller 100 in accordance with an exemplary embodiment of the invention, during the auto scan by the DAS controller 100, if any location in memory is detected as a faulty location, the address of the location will be stored in the buffer manager and the location's contents will be stored in local SRAM. Subsequently, all access requests to the DDR memory will be snooped and if the address of the faulty location is hit, then the access will be routed to this local SRAM.

To perform this operation, an 8 deep CAM can be used where faulty location addresses are stored as contents of CAM.

As the DDR memory read has a 3 clock cycle latency, the CAM searching need not to be finished in single cycle. Therefore, as a simple alternative to CAM, the faulty location address can be stored in registers and 8 comparators can be used to check a hit. Then, the $2^{nd}$ cycle can be used to read the data of that location from the local SRAM.

In accordance with various embodiments, a method for testing a System-on-Chip (SoC) that is similar to various embodiments previously described herein is provided. In essence, the method provided includes testing of the SoC without the need for an external DDR memory or an external disk recording/playing device.

Figure 6:
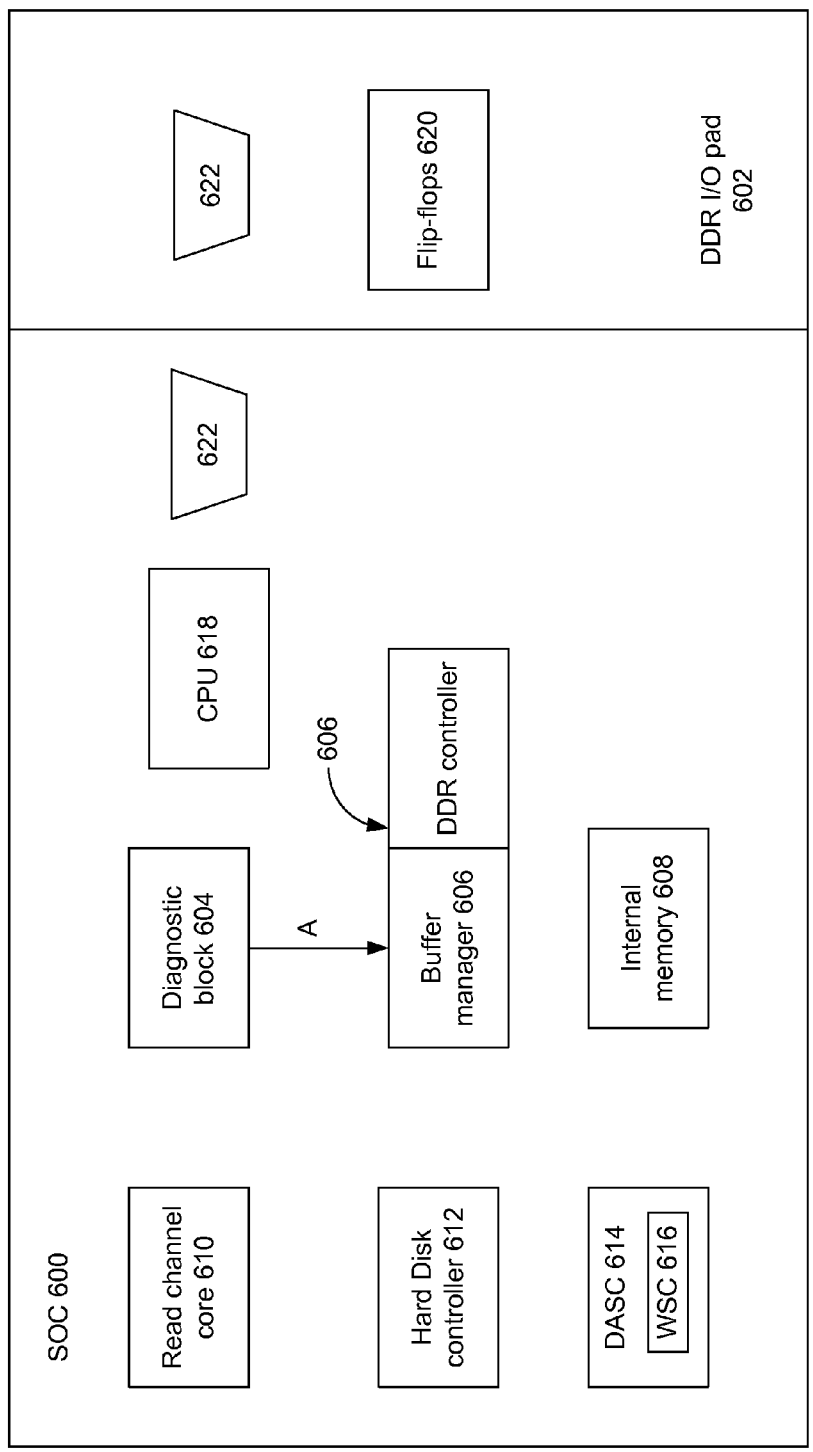
FIG. 6 is a block diagram schematically illustrating an embodiment of a System on Chip, in accordance with various embodiments of the present disclosure.

FIG. 6 schematically illustrates a System-on-Chip (SoC) 600 that includes a DDR memory interface (I/O) pad 602. The SoC 600 further includes a diagnostics block 604, a buffer manager/DDR controller 606, an internal memory 608 (generally in the form of static random access memory (SRAM)), a read channel core 610 and a hard disk controller 612. The SoC 600 also includes a DDR automated scan controller (DASC) 614 that includes a writeable control storage (WSC) RAM 616. In various embodiments, the SoC 600 generally includes a central processing unit (CPU) 618.

In accordance with the present embodiment, in order to test the SoC 600 at very high speeds, the chip that includes the SoC 600 is tested on automatic test equipment (ATE) (not shown) by mounting the chip on a board of the ATE and not coupling the chip to any other external components. As can be seen in FIG. 6, the diagnostics block 604 generates an initial data stream A or test pattern that is provided to the buffer manager/DDR controller 606.

Figure 7A:
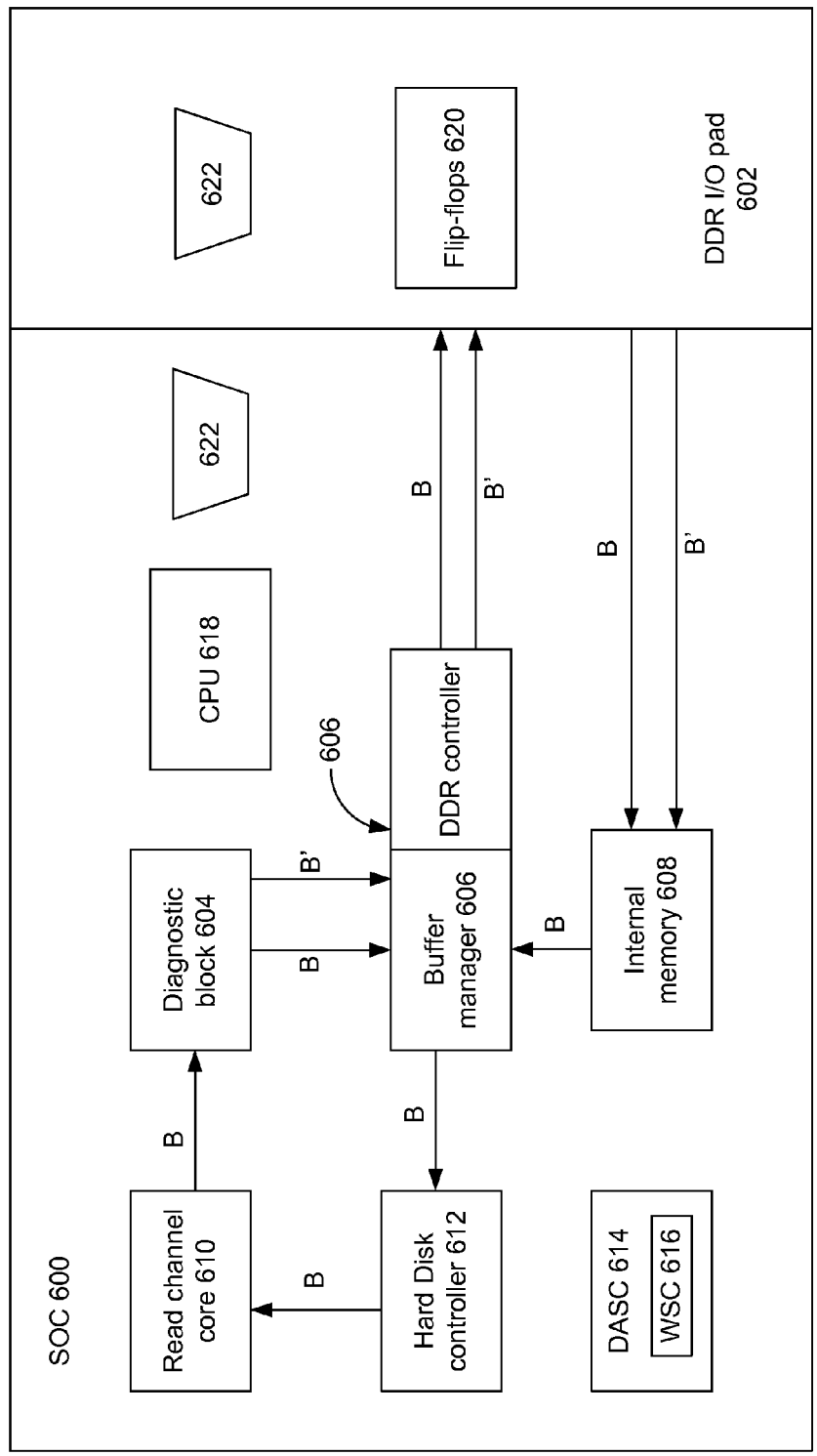
FIG. 7a is a block diagram schematically illustrating an embodiment of the System on Chip during testing, in accordance with various embodiments of the present disclosure.

Referring to FIG. 7a, during testing, in order to emulate writing the data stream to an external disk recorder/player device, the data stream A is provided (illustrated as data stream B in FIG. 7a) from the buffer manager/DDR controller 606 to the DDR I/O pad 602, which then routes the data stream B to the internal memory 608. The data stream B is then provided from the internal memory 608 to the buffer manager/DDR controller 606, which provides the data stream B to the hard disk controller 612, which in turn provides the data stream B to the read channel core 610, which in turn provides the data stream B to the diagnostics block 604. The diagnostics block 604 then provides the data stream B (as data stream B') back to the buffer manager/DDR controller 606. Data stream B' is then provided back to the internal memory 608 via the DDR I/O pad 602.

Figure 7B:
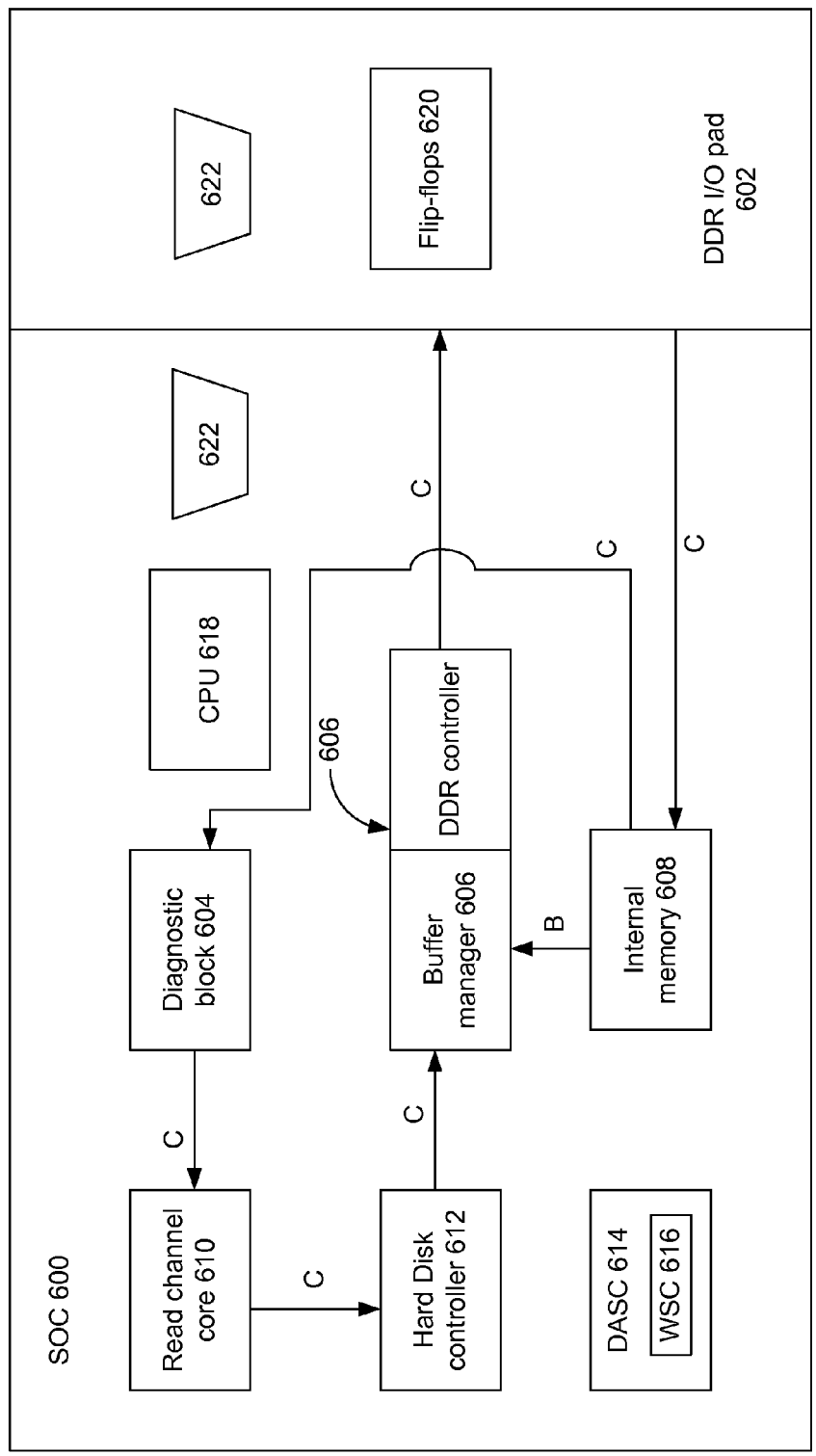
FIG. 7b is a block diagram schematically illustrating an embodiment of the System on Chip during further testing, in accordance with various embodiments of the present disclosure.

Next, with reference to FIG. 7b, in order to emulate reading the data stream A, the data stream B is provided (illustrated as data stream C in FIG. 7b) from the internal memory 608 back to the diagnostics block 604, which provides the data stream C to the read channel core 610, which provides the data stream to the hard disk controller 612, which in turn provides the data stream to the buffer manager/DDR controller 606. The data stream C is then provided from the buffer manager/DDR controller 606 to the DDR I/O pad 602, which provides the data stream back to the internal memory 608. The initial data stream A is now in its final stage at the internal memory after having moved through the SoC 600 as data streams B and C. This final stage of the data stream, specifically data stream C, is then compared to the initial data stream A or test pattern generated by the diagnostics block 604. The final stage of data stream C should be the same as the initial data stream A. If it is the same, within a margin of error, then the SoC 600 has passed the test. If not, then the SoC 600 has failed the test. In accordance with various embodiments, the diagnostics block 604 does the comparison. However, the CPU 618 or the DASC 614 could also perform the comparison.

Figure 8:
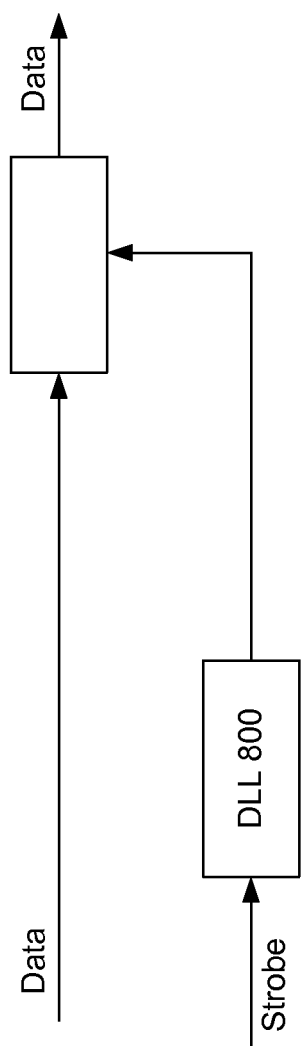
FIG. 8 is a block diagram schematically illustrating a timing arrangement for testing of the System on Chip, in accordance with various embodiments of the present disclosure.

In accordance with various embodiments, multiple tests are performed on the SoC 600. The repeated iterations of the test are performed at various operating frequencies of the SoC 600. A strobe signal is generally utilized to control the multiple iterations of the testing. In order to synchronize the strobe with the flow of the data streams, a delay locked loop (DLL) 800 is generally provided for use with the strobe as can be seen in the timing diagram of FIG. 8. In accordance with various embodiments, the DASC 614 controls the DLL 800, thereby freeing up the CPU 614 to perform other functions.

Referring back to FIG. 6, in accordance with various embodiments, flip flops 620 are provided within the DDR I/O pad 602 to route the data streams to the internal memory 608. Multiplexors 622 can be provided within the SoC 600, either within the DDR I/O pad 602 as illustrated or external thereto, in order to control routing of the signals to either the flip flops (for testing of the SoC) or to an external DDR memory device (when the SoC is in use in the field).

Figure 9:
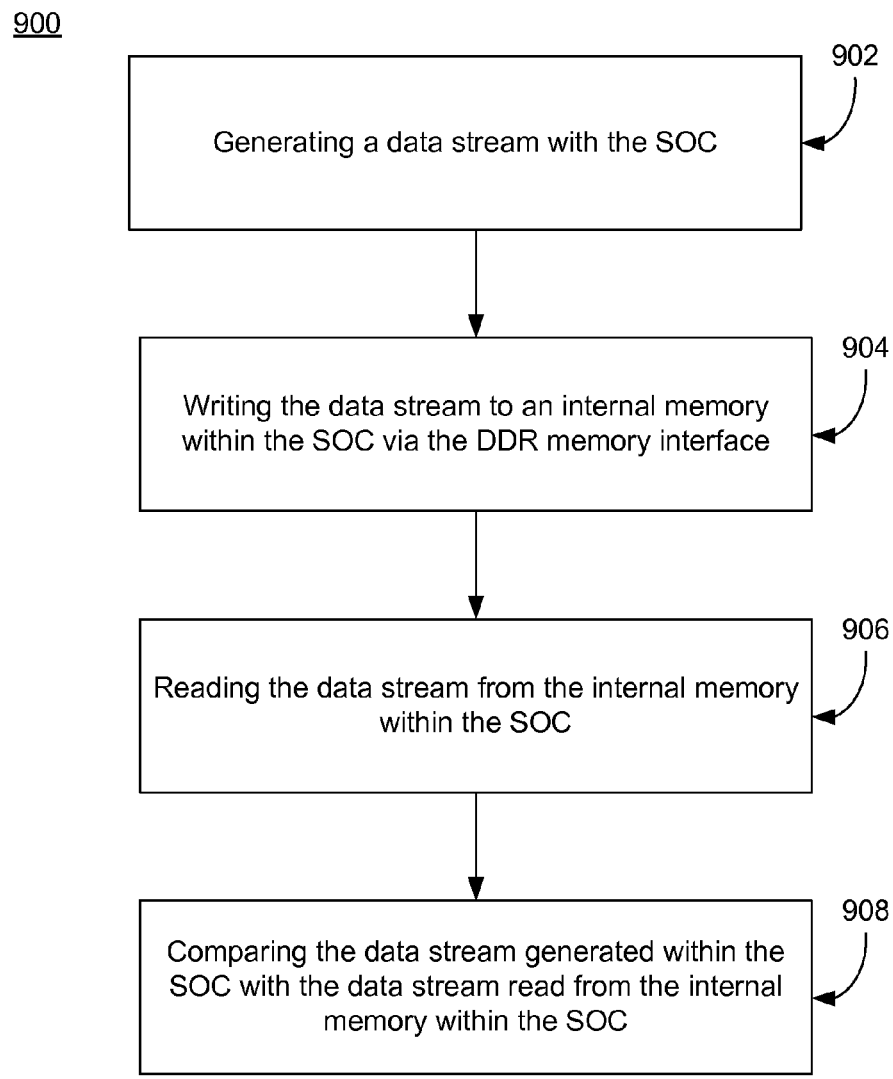
FIG. 9 is a flow chart illustrating a testing procedure for testing of the System on Chip, in accordance with various embodiments of the present disclosure.

Accordingly, with reference to FIG. 9, the present disclosure provides a method 900 of testing a double data rate (DDR) memory interface within a system-on-chip (SoC). The method 900 includes, at 902, generating a data stream within the SoC and, at 904, writing the data stream to an internal memory within the SoC via the DDR memory interface. The method 900 further includes, 906, reading the data stream from the internal memory within the SoC and, at 908, comparing the data stream generated within the SoC with the data stream read from the internal memory within the SoC.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

The invention claimed is:

1. A method comprising:
   generating, within a System-on-chip (SoC), a data stream expected to be written to a memory, wherein the memory is internal to the SoC;
   performing a first write, to the memory via a memory interface, of the data stream expected to be written to the memory;
   subsequent to performing the first write, performing a first read, from the memory, of a data stream that was written to the memory as a result of the first write;
   subsequent to performing the first read, performing a second write, to the memory via the memory interface, of the data stream that was read from the memory as a result of the first read;
   subsequent to performing the second write, performing a second read, from the memory, of a data stream that was written to the memory as a result of the second write; and
   comparing (i) the data stream expected to be written to the memory with (ii) the data stream that was read from the memory as a result of the second read.

2. The method of claim 1, wherein the data stream expected to be written to the memory is generated by a diagnostics block within the SoC.

3. The method of claim 2, wherein performing the first write comprises:
   providing the data stream expected to be written to the memory from the diagnostics block to a buffer manager/controller;
   subsequent to providing the data stream expected to be written to the memory from the diagnostics block to the buffer manager/controller, providing the data stream expected to be written to the memory from the buffer manager/controller to the memory interface; and
   subsequent to providing the data stream expected to be written to the memory from the buffer manager/controller to the memory interface, performing the first write of the data stream expected to be written to the memory from the memory interface.

4. The method of claim 1, further comprising:
   subsequent to performing the first read, providing the data stream that was read from the memory as the result of the first read to the buffer manager/controller;
   subsequent to providing the data stream that was read from the memory as the result of the first read to the buffer manager/controller, providing the data stream that was read from the memory as the result of the first read from the buffer manager/controller to a hard disk controller;

subsequent to providing the data stream that was read from the memory as the result of the first read from the buffer manager/controller to the hard disk controller, providing the data stream that was read from the memory as the result of the first read from the hard disk controller to a read channel core; and subsequent to providing the data stream that was read from the memory as the result of the first read from the hard disk controller to the read channel core, providing the data stream that was read from the memory as the result of the first read from the read channel core to the diagnostics block.

5. The method of claim 4, wherein performing the second write comprises:

subsequent to providing the data stream that was read from the memory as the result of the first read from the read channel core to the diagnostics block, re-providing the data stream that was read from the memory as the result of the first read from the diagnostics block to the buffer manager/controller;

subsequent to re-providing the data stream that was read from the memory as the result of the first read from the diagnostics block to the buffer manager/controller, re-providing the data stream that was read from the memory as the result of the first read from the buffer manager/controller to the memory interface; and subsequent to re-providing the data stream that was read from the memory as the result of the first read from the buffer manager/controller to the memory interface, performing the second write of the data stream that was read from the memory as the result of the first read from the memory interface.

6. The method of claim 1, wherein the method is executed multiple times.

7. The method of claim 6, wherein each subsequent execution of the method is performed at a different operating frequency with the SoC.

8. A System on Chip comprising:
memory interface;
a memory coupled to the memory interface;
means for generating, within the System-on-chip, a data stream expected to be written to the memory;
means for performing a first write, to the memory via the memory interface, of the data stream-expected to be written to the memory;
means for performing a first read, from the memory, of a data stream that was written to the memory as a result of the first write, wherein the first read is performed subsequent to performing the first write;
means for performing a second write, to the memory via the memory interface, of the data stream that was read from the memory as a result of the first read, wherein the second write is performed subsequent to performing the first read;
means for performing a second read, from the memory, of a data stream that was written to the memory as a result of the second write, wherein the second read is performed subsequent to performing the second write; and
means for comparing (i) the data stream expected to be written to the memory (ii) with the data stream that was read from the memory as a result of the second read.

9. The System on Chip of claim 8, wherein the means for comparing comprises a diagnostics block.

10. The System on Chip of claim 9, further comprising a DDR automated scan controller.

11. The System on Chip of claim 10, wherein the DDR automated scan controller is configured to control testing of the system on a chip.

12. The System on Chip of claim 8, further comprising a central processing unit (CPU).

13. The System on Chip of claim 12, wherein the CPU is configured to control testing of the system on a chip.

14. The System on Chip of claim 12, wherein the means for comparing comprises the CPU.

15. The System on Chip of claim 8, wherein the means for performing a first write comprises flip-flops within the DDR memory interface and a multiplexor.

* * * * *